United States Patent [19]
Akata

[11] Patent Number: 5,189,315
[45] Date of Patent: Feb. 23, 1993

[54] HIGH-SPEED FLIP FLOP CIRCUIT WITH MASTER LATCHING CIRCUIT FREE FROM INFLUENCE OF SLAVE LATCHING CIRCUIT

[75] Inventor: Masao Akata, Tokyo, Japan
[73] Assignee: NEC Corp., Tokyo, Japan
[21] Appl. No.: 830,706
[22] Filed: Feb. 4, 1992
[30] Foreign Application Priority Data Feb. 18, 1991 [JP] Japan .................................. 3-045934

[51] Int. Cl.[5] ...................... H03K 3/289; H03K 3/356
[52] U.S. Cl. .............................. 307/272.2; 307/272.3; 307/279
[58] Field of Search ............... 307/272.1, 272.2, 272.3, 307/290, 279

[56] References Cited

U.S. PATENT DOCUMENTS

| | | | |
|---|---|---|---|
| 4,613,773 | 9/1986 | Koike | 307/279 |
| 4,794,276 | 12/1988 | Sasada et al. | 307/279 |
| 4,843,254 | 6/1989 | Motegi et al. | 307/272.2 |
| 4,939,384 | 7/1990 | Shikata et al. | 307/272.2 |
| 5,017,808 | 5/1991 | Ueno et al. | 307/272.2 |
| 5,027,382 | 6/1991 | Hiroe et al. | 377/76 |

FOREIGN PATENT DOCUMENTS

| | | | |
|---|---|---|---|
| 0079318 | 4/1986 | Japan | 307/279 |
| 0260421 | 11/1987 | Japan | 307/272.2 |
| 0018814 | 1/1988 | Japan | 307/272.2 |
| 0158817 | 6/1989 | Japan | 307/272.2 |
| 0104016 | 4/1990 | Japan | 307/272.2 |
| 0246610 | 10/1990 | Japan | 307/272.2 |

OTHER PUBLICATIONS

Research Disclosure, "CMOS L1L2 Latch Which Compares Bipolar Levels"; Jul. 1991.

Primary Examiner—William L. Sikes
Assistant Examiner—Terry D. Cunningham
Attorney, Agent, or Firm—Whitham & Marhoefer

[57] ABSTRACT

A flip flop circuit comprises a master latching circuit having a first transmission gate responsive to a clock signal and the complementary clock signal for transferring a data bit to a first positive feedback loop, and a slave latching circuit having a second transmission gate responsive to the clock signal and the complementary clock signal and complementarily shifted between on and off states with respect to the first transmission gate for transferring a data bit to a second positive feedback loop, wherein a buffer circuit is coupled between the first positive feedback loop and the first transmission gate so that the master flip flop circuit is free from influence of the slave flip flop circuit, thereby allowing a circuit designer to shrink set-up time margin.

8 Claims, 2 Drawing Sheets

HIGH-SPEED FLIP FLOP CIRCUIT WITH MASTER LATCHING CIRCUIT FREE FROM INFLUENCE OF SLAVE LATCHING CIRCUIT

FIELD OF THE INVENTION

This invention relates to a high speed flip flop circuit implemented by field effect transistors and, more particularly, to a master-slave flip flop circuit.

DESCRIPTION OF THE RELATED ART

A typical example of the flip flop circuit is illustrated in FIG. 1, and largely comprises a master latching circuit 1 and a slave latching circuit 2 coupled in series between inverting circuits 3 and 4 respectively associated with an input node 5 and an output node 6. A clock signal CLK1 is twice inverted by inverting circuits 7 and 8 so as to supply a clock signal CLK2 and a complementary clock signal CCLK2 to the master latching circuit 1 and the slave latching circuit 2 in a parallel manner. The inverting circuits 7 and 8 form in combination an internal clock generator 9. A reset signal RS is directly supplied to the master latching circuit 1 as well as to the slave latching circuit 2. The inverting circuit 3 aims at blocking the input node 5 from variable impedance due to the master latching circuit 1, and the output node 6 is blocked from the variable impedance due to the slave latching circuit 2 by means of the inverting circuit 4.

The master latching circuit 1 largely comprises a transmission gate 1a coupled with the inverting circuit 3 and a positive feedback loop 1b coupled between the transmission gate 1a and the output node 1c thereof. The transmission gate 1a is used for sampling the voltage level at the output node of the inverting circuit 3, and the positive feedback loop 1b stores the sampled data bit. A high voltage level is hereinbelow assumed to correspond to logic "1" level. The positive feedback loop 1b is implemented by an inverting circuit 1d, a NAND gate 1e and a transmission gate 1f, and is operative to retain the sampled data bit supplied from the inverting circuit 3. Each of the transmission gates 1a and 1e consists of a parallel combination of a p-channel enhancement type field effect transistor Qp1 and an n-channel enhancement type field effect transistor Qn1, and the transmission gates 1a and 1f complementarily turn on and off. Namely, the clock signal CLK2 is supplied to the p-channel enhancement type field effect transistor Qp1 of the transmission gate 1a as well as to the n-channel enhancement type field effect transistor Qn1 of the other transmission gate 1f. On the other hand, the complementary clock signal CCLK2 is supplied to the n-channel enhancement type field effect transistor Qn1 of the transmission gate 1a as well as to the p-channel enhancement type field effect transistor Qp1 of the other transmission gate 1a. Therefore, when the sampled data bit is transferred to the positive feedback loop 1b, the inverting circuit 1d is blocked from the previous sampled data bit by means of the transmission gate 1f. The reset signal RS is supplied to the NAND gate 1e, and cancels the sampled data bit at the output node of the NAND gate 1e.

The slave latching circuit 2 similarly comprises a transmission gate 2a coupled with the output node 1c of the master latching circuit 1 and a positive feedback loop 2b coupled between the transmission gate 2a and the output node 2c thereof. The transmission gate 2a transfers the sampled data bit at the output node 1c to the positive feedback loop 2b, and the positive feedback loop 2b stores the sampled data bit. The positive feedback loop 2b is implemented by a NAND gate 2d, an inverting circuit 2e and a transmission gate 2f, and is operative to retain the sampled data bit supplied from the master latching circuit 1. Each of the transmission gates 2a and 2f consists of a parallel combination of a p-channel enhancement type field effect transistor Qp2 and an n-channel enhancement type field effect transistor Qn2, and the transmission gates 2a and 2f complementarily turn on and off. Namely, the complementary clock signal CCLK2 is supplied to the p-channel enhancement type field effect transistor Qp2 of the transmission gate 2a as well as to the n-channel enhancement type field effect transistor Qn2 of the other transmission gate 2f. On the other hand, the clock signal CLK2 is supplied to the n-channel enhancement type field effect transistor Qn2 of the transmission gate 2a as well as to the p-channel enhancement type field effect transistor Qp2 of the other transmission gate 2a. Therefore, when a sampled data bit is transferred to the positive feedback loop 2b, the input node of the NAND gate 2d is blocked from the previous sampled data bit by means of the transmission gate 2f. The reset signal RS is supplied to the NAND gate 2d, and cancels the sampled data bit at the output node of the NAND gate 2d and, accordingly, the output node of the inverting circuit 2e.

The prior art flip flop circuit thus arranged accepts a sampled data bit into the master latching circuit 1 at the trailing edge of the clock signal CLK from logic "1" to logic "0", and the master latching circuit 1 retains the sampled data bit while the clock signal CLK remains in logic "1" level. The slave latching circuit 2 behaves as the opposite manner to the master latching circuit 1 due to the clock signal CLK2 and the complementary clock signal CCLK oppositely supplied to the transmission gates 2a and 2f, and the sampled data bit is transferred from the master latching circuit 1 to the output inverting circuit 4 at the leading edge of the clock signal CLK1 from logic "0" to logic "1".

A problem is encountered in the prior art flip flop circuit in that the master latching circuit 1 is susceptible to influence from the slave latching circuit 2. This is because of the direct coupling between the master latching circuit 1 and the slave latching circuit 2. The influence is hereinbefore described in detail with reference to FIG. 2. Before time t1, the transmission gate 1a is turned on with the clock signal CLK2 of logic "0" level as well as with the complementary clock signal CCLK2 of logic "1" level, however, the clock signal CLK2 and the complementary clock signal CCLK2 cause the transmission gates 1f and 2a to turn off. In this circumstance, the input node of the inverting circuit 1d is coupled with the output node of the inverting circuit 3, and the slave latching circuit 2 is blocked from the output node 1c. The previous data bit of logic "0" level has been already transferred to the slave latching circuit 2b, and is stored in the positive feedback loop 2b.

A data bit of logic "1" level is supplied from the input node 5 to the inverting circuit 3 at time t1, and the inverting circuit 3 changes the logic level at the output node thereof from logic "1" to logic "0". The input node of the inverting circuit 1d starts going down from the high voltage level toward a low voltage level at time t1, and, accordingly, the output node of the inverting circuit 1d rises toward the high voltage level. However, if the clock signal CLK1 is changed from logic "0" to logic "1" at time t2, the transmission gate 1a starts turning off, and the inversion at the input node of the inverting circuit 1d is decelerated. Moreover, the transmission gate 2a starts on turning on at time t2, and electric charge at the output node of the inverting circuit 1d is taken up by the positive feedback loop 2b. This results in that the input node and the output node of the inverting circuit 1d are recovered to the previous levels, i.e., the high voltage level and the low voltage level, and the input node of the NAND gate 1e also turns back to the low voltage level. In other words, the master latching circuit 1 is affected by the slave latching circuit 2, and is hardly inverted under the influence of the slave latching circuit. This undesirable phenomenon is known as "short set-up time period", and the prior art flip flop circuit behaves at tight sequence, i.e., small margin. If the slave latching circuit 2 stores a sampled data bit of logic "1", the slave latching circuit 2 accelerates the inversion at the output node of the inverting circuit 1d. However, a designer designs an electric circuit with the maximum margin for the prior art flip flop circuit incorporated therein in view of stable operation, and, accordingly, the electric circuit consumes relatively long time period.

SUMMARY OF THE INVENTION

It is therefore an important object of the present invention provide a flip flop circuit operable at improved speed.

To accomplish the object, the present invention proposes to block a master latching circuit from influence of a slave latching circuit.

In accordance with the present invention, there is provided a flip flop circuit comprising a) a master latching circuit having a first transmission gate responsive to a clock signal and the complementary clock signal thereof for transferring a data bit, and a first positive feedback loop coupled between the first transmission gate and an output node for temporally storing the data bit, b) a slave latching circuit having a second transmission gate responsive to the clock signal and the complementary clock signal and complementarily shifted between on and off states with respect to the first transmission gate, and a second positive feedback loop coupled with the second transmission gate for temporally storing a data bit, and c) a buffer circuit coupled between the output node of the master latching circuit and the first transmission gate.

BRIEF DESCRIPTION OF THE DRAWINGS

The feature and advantages of the flip flop circuit according to the present invention will be more clearly understood from the following description taken in conjunction with the accompanying drawings in which.

DESCRIPTION OF THE PREFERRED EMBODIMENT

Figure 3:
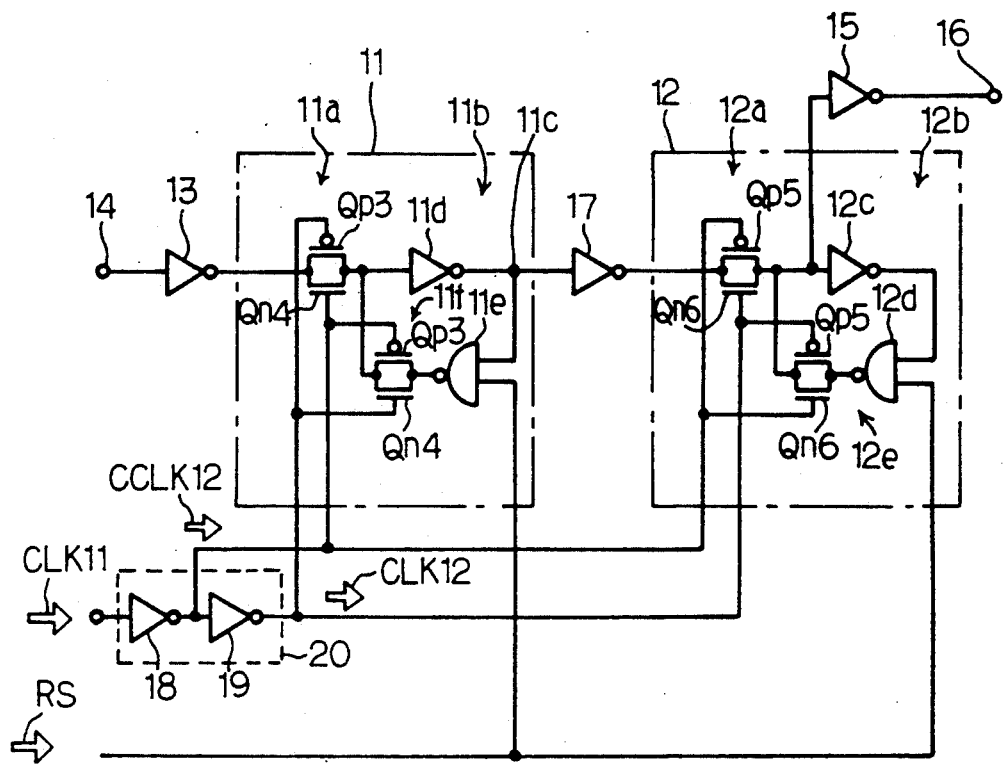
FIG. 3 is a circuit diagram showing the arrangement of a flip flop circuit according to the present invention.

Referring to FIG. 3 of the drawings, a flip flop circuit embodying the present invention largely comprises a master latching circuit 11, a slave latching circuit 12, an input inverting circuit 3 coupled between an input node 14 and the master latching circuit 11, an output inverting circuit 15 coupled between the slave latching circuit 12 and an output node 16, and a buffer circuit 17 coupled between the master latching circuit 11 and the slave latching circuit 12. A clock signal CLK11 is twice inverted by inverting circuits 18 and 19 so as to supply a clock signal CLK12 and a complementary clock signal CCLK12 to the master latching circuit 11 as well as to the slave latching circuit 12. The inverting circuits 18 and 19 form in combination an internal clock generator 20. A reset signal RS is directly supplied to the master latching circuit 11 and to the slave latching circuit 12. The input inverting circuit 13 aims at blocking the input node 14 from variable impedance due to the master latching circuit 11, and the output node 16 is blocked from the variable impedance due to the slave latching circuit 12 by means of the output inverting circuit 15.

The master latching circuit 11 largely comprises a transmission gate 11a coupled with the input inverting circuit 13 and a positive feedback loop 11b coupled between the transmission gate 11a and an output node 11c thereof. The transmission gate 11a is used for sampling the voltage level at the output node of the input inverting circuit 13, and the positive feedback loop 11b stores the sampled data bit. A high voltage level is also assumed to correspond to logic "1" level. The positive feedback loop 11b is implemented by an inverting circuit 11d, a NAND gate 11e and a transmission gate 11f, and is operative to temporally store the sampled data bit supplied from the input inverting circuit 13. Each of the transmission gates 11a and 11e is implemented by a parallel combination of a p-channel enhancement type field effect transistor Qp3 and an n-channel enhancement type field effect transistor Qn4, and the transmission gates 11a and 11f complementarily turn on and off. Namely, the clock signal CLK12 is supplied to the p-channel enhancement type field effect transistor Qp3 of the transmission gate 11a as well as to the n-channel enhancement type field effect transistor Qn4 of the other transmission gate 11f. Accordingly, the complementary clock signal CCLK12 is supplied to the n-channel enhancement type field effect transistor Qn4 of the transmission gate 11a as well as to the p-channel enhancement type field effect transistor Qp3 of the other transmission gate 11a. Therefore, when the sampled data bit is transferred to the positive feedback loop 11b, the inverting circuit 11d is blocked from the previous sampled data bit by means of the transmission gate 11f. The reset signal RS is supplied to the NAND gate 11e, and cancels the sampled data bit at the output node of the NAND gate 11e. The output node 11c is coupled with the input node of the buffer circuit 17, and the buffer circuit 17 allows the master latching circuit 11 to be free from influence of the slave latching circuit 12. In this instance, the buffer circuit 17 is implemented by an inverting circuit. Thus, the complementary data bit is supplied to the slave latching circuit 12 due to the buffer circuit 17, however, the output inverting circuit 15 retrieves the logic level of a data bit supplied from the master latching circuit 11 to the buffer circuit 17.

The slave latching circuit 12 similarly comprises a transmission gate 12a coupled with the output node of the buffer circuit 17, and a positive feedback loop 12b coupled with the transmission gate 12a as well as with the output inverting circuit 15. The transmission gate 12a transfers the sampled data bit from the buffer circuit 17 to the positive feedback loop 12b, and the positive feedback loop 12b stores the sampled data bit. The positive feedback loop 12b is implemented by an inverting circuit 12c, a NAND gate 12d and a transmission gate 12e, and is operative to temporally store the sampled data bit supplied from the master latching circuit 11 through the buffer circuit 17. The NAND gate 12d is coupled between the inverting circuit 12c and the transmission gate 12e, and the location of the NAND gate 12d and the location of the inverting circuit 12c are exchanged in comparison with the prior art slave latching circuit 2. The reason for the replacement between the inverting circuit 12c and the NAND gate 12d is that the reset signal RS is expected to forcibly change the output node 16 to logic "0" level. Each of the transmission gates 12a and 12e is implemented by a parallel combination of a p-channel enhancement type field effect transistor Qp5 and an n-channel enhancement type field effect transistor Qn6, and the transmission gates 12a and 12e complementarily turn on and off. Namely, the complementary clock signal CCLK12 is supplied to the p-channel enhancement type field effect transistor Qp5 of the transmission gate 12a as well as to the n-channel enhancement type field effect transistor Qn6 of the other transmission gate 12e. On the other hand, the clock signal CLK12 is supplied to the n-channel enhancement type field effect transistor Qn6 of the transmission gate 12a as well as to the p-channel enhancement type field effect transistor Qp5 of the other transmission gate 12a. Therefore, when a sampled data bit is transferred to the positive feedback loop 12b, input node of the inverting circuit 12c is blocked from the previous sampled data bit by means of the transmission gate 12e. The reset signal RS is supplied to the NAND gate 12d, and cancels the sampled data bit at the output node of the NAND gate 12d.

Figure 1:
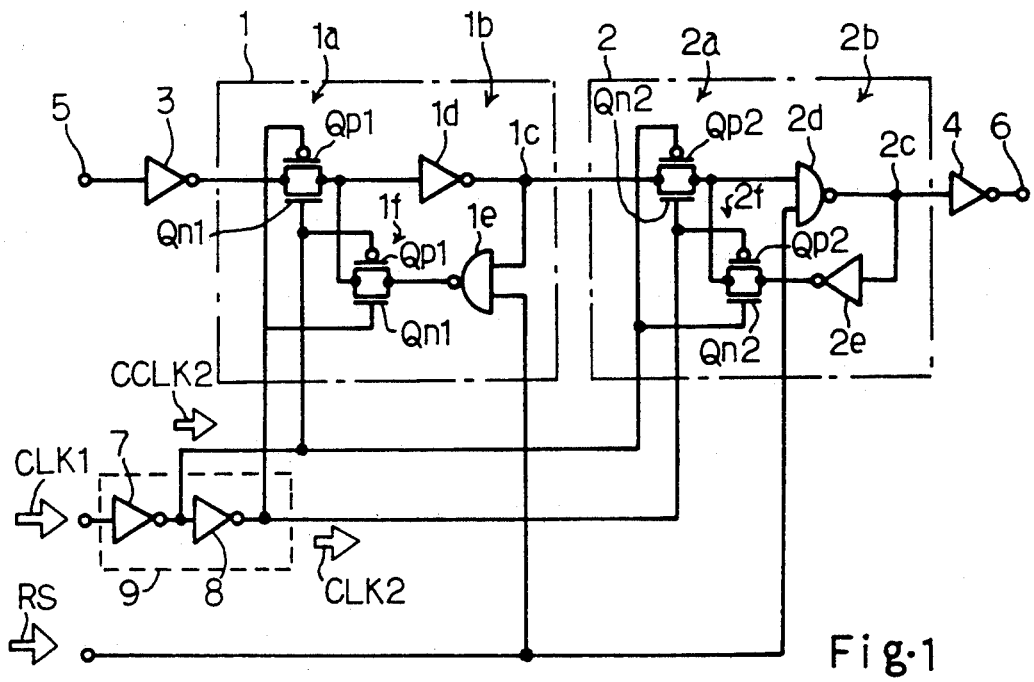
FIG. 1 is a circuit diagram showing the arrangement of the prior art flip flop circuit.
Figure 2:
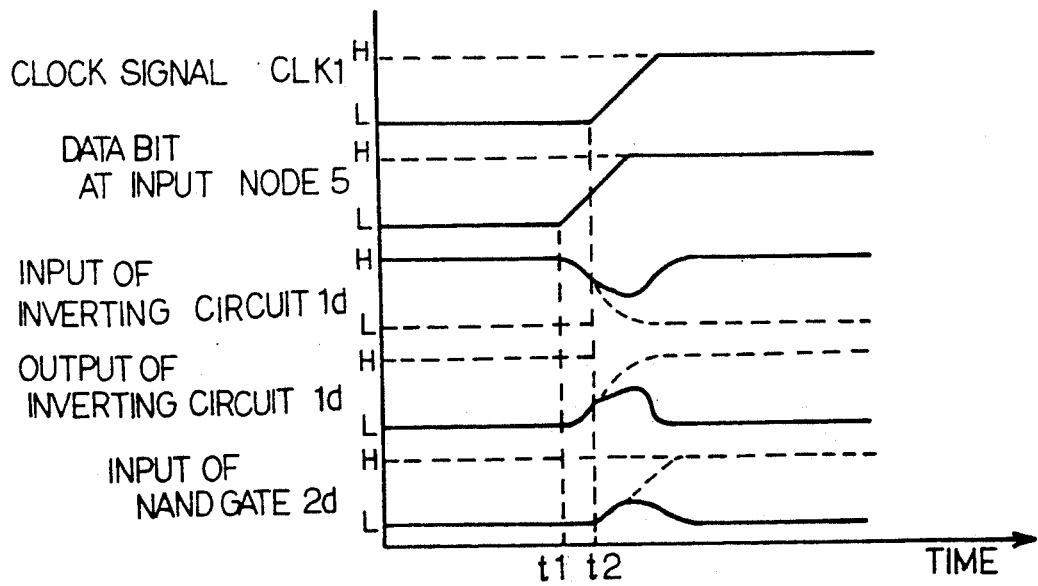
FIG. 2 is a timing chart showing the circuit behavior of the prior art flip flop circuit.
Figure 4:
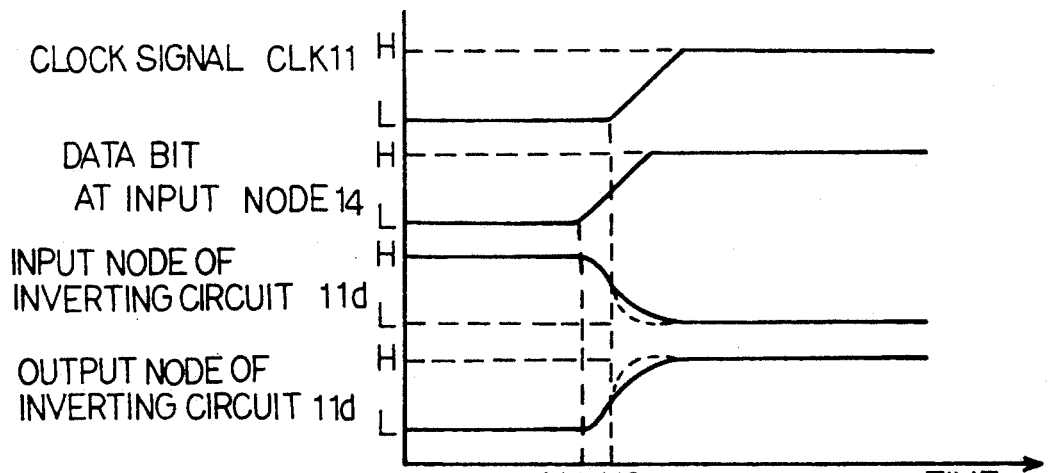
FIG. 4 is a timing chart showing the circuit behavior of the flip flop circuit shown in FIG. 3.

The flip flop circuit thus arranged behaves as follows. FIG. 4 shows a sequence of operation achieved by the flip flop circuit according to the present invention. The initial state of the flip flop circuit is similar to that of the prior art described with reference to FIG. 2, and the transmission gate 11a is turned on with the clock signal CLK12 of logic "0" level as well as with the complementary clock signal CCLK12 of logic "1" level. However, the clock signal CLK12 and the complementary clock signal CCLK12 cause the transmission gates 11f and 12a to turn off. In this circumstance, the input node of the inverting circuit 11d is coupled with the output node of the input inverting circuit 13, and the slave latching circuit 12 is blocked from the buffer circuit 17. The complementary data bit of the previous data bit has been already transferred from the buffer circuit 17 to the slave latching circuit 12b, and is stored in the positive feedback loop 12b. Since the previous data bit is logic "0" level, the positive feedback loop 12b temporally stores the complementary data bit of logic "1".

A data bit of logic "1" level is supplied from the input node 14 to the input inverting circuit 13 at time t11, and the input inverting circuit 13 changes the logic level at the output node thereof from logic "1" to logic "0". The input node of the inverting circuit 11d starts on going down from the high voltage level toward a low voltage level at time t11, and, accordingly, the output node of the inverting circuit 11d rises toward the high voltage level. If the clock signal CLK11 is changed from logic "0" to logic "1" at time t12, the transmission gate 11a starts on turning off, and the inversion at the input node of the inverting circuit 11d is decelerated.

Although the transmission gate 12a concurrently starts on turning on, no electric charge at the output node of the inverting circuit 11d is taken up by the positive feedback loop 12b because of the buffer circuit 17, and the data bit is correctly stored in the master latching circuit 11. Thus, the master latching circuit 11 is free from the influence of the slave latching circuit 12, and small margin never deteriorates the stability of the sequence. This results in greater set-up time margin, and consequently contributes to capability for high clock rate application.

As will be understood from the foregoing description, the buffer circuit 17 inserted between the master latching circuit 11 and the slave latching circuit 12 blocks the master latching circuit 11 from undesirable influence of the slave latching circuit 12, and the flip flop circuit 12 achieves high speed operation without sacrifice of the stability.

Although particular embodiments of the present invention have been shown and described, it will be obvious to those skilled in the art that various changes and modifications may be made without departing from the spirit and scope of the present invention.

What is claimed is:

1. A flip flop circuit comprising:
 a) a master latching circuit having a first transmission gate responsive to a clock signal and the complementary clock signal therefor for passing a data bit, and a first positive feedback loop coupled between said first transmission gate and an output node of said master latching circuit for temporally storing the data bit,
 b) a slave latching circuit having a second transmission gate responsive to said clock signal and said complementary clock signal and complementarily shifted between on and off states with respect to said first transmission gate, and a second positive feedback loop coupled with said second transmission gate for temporally storing a data bit, and
 c) an asynchronous type buffer circuit coupled between the output node of said master latching circuit and said second transmission gate, said first positive feedback loop comprising a first inverting circuit with an input node coupled with said first transmission gate, a first logic gate with a reset node and a data input node coupled with the output node of said first inverting circuit, and a third transmission gate coupled between the output node of said first logic gate and the input node of said first inverting circuit.

2. A flip flop circuit as set forth in claim 1, in which said flip flop circuit further comprises:
 d) an input inverting circuit coupled between an input node and said first transmission gate.

3. A flip flop circuit as set forth in claim 2, in which said first logic gate is implemented by a NAND gate.

4. A flip flop circuit as set forth in claim 2, in which each of said first and third transmission gates is implemented by a parallel combination of a first enhancement transistor of a first channel conductivity type and a second enhancement transistor of a second channel conductivity type opposite to said first channel conductivity type, said clock signal and said complementary clock signal being supplied to said first and second enhancement transistors, so as to complementarily shift said first and third transmission gates between on and off states.

5. A flip flop circuit as set forth in claim 1, in which said buffer circuit is implemented by an inverting circuit.

6. A flip flop circuit as set forth in claim 5, in which said second positive feedback loop comprises a second inverting circuit with an input node coupled with said second transmission gate, a second logic gate with a reset node and a data input node coupled with the output node of said second inverting circuit, and a fourth transmission gate coupled between the output node of said second logic gate and the input node of the second inverting circuit.

7. A flip flop circuit as set forth in claim 6, in which said second logic gate is implemented by a NAND gate.

8. A flip flop circuit as set forth in claim 6, in which each of said second and fourth transmission gates is implemented by a parallel combination of a third enhancement transistor of said first channel conductivity type and a fourth enhancement transistor of said second channel conductivity type, said clock signal and said complementary clock signal being supplied to said third and fourth enhancement transistors, so as to complementarily shift said second and fourth transmission gates between on and off states.

* * * * *